(12) United States Patent
Birner et al.

(10) Patent No.: US 11,728,389 B2
(45) Date of Patent: Aug. 15, 2023

(54) GROUP III NITRIDE DEVICE HAVING AN OHMIC CONTACT

(71) Applicant: Infineon Technologies AG, Neubiberg (DE)

(72) Inventors: Albert Birner, Regensburg (DE); Jan Ropohl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/695,366

(22) Filed: Mar. 15, 2022

(65) Prior Publication Data

US 2022/0208972 A1    Jun. 30, 2022

Related U.S. Application Data

(62) Division of application No. 16/694,070, filed on Nov. 25, 2019, now Pat. No. 11,302,783.

(30) Foreign Application Priority Data

Nov. 28, 2018  (EP) ..................... 18208960

(51) Int. Cl.
    *H01L 29/45*     (2006.01)
    *H01L 29/20*     (2006.01)
    (Continued)

(52) U.S. Cl.
    CPC ........ *H01L 29/2003* (2013.01); *H01L 21/283* (2013.01); *H01L 29/401* (2013.01); *H01L 29/452* (2013.01); *H01L 29/778* (2013.01)

(58) Field of Classification Search
    CPC ..................................... H01L 29/452
    (Continued)

(56) References Cited

U.S. PATENT DOCUMENTS

| 5,389,564 A | 2/1995 | Bernhardt et al. |
| 2008/0014687 A1 | 1/2008 | Vora et al. |

(Continued)

FOREIGN PATENT DOCUMENTS

| CN | 102652363 A | 8/2012 |
| CN | 107230617 A | 10/2017 |

(Continued)

OTHER PUBLICATIONS

Yao, Jing-Neng, et al., "An Au-free GaN High Electron Mobility Transistor with Ti/Al/W Ohmic Metal Structure", 2015 IEEE 22nd International Symposium on the Physical and Failure Analysis of Integrated Circuits, 2015, pp. 419-422.

*Primary Examiner* — Hsin Yi Hsieh
(74) *Attorney, Agent, or Firm* — Murphy, Bilak & Homiller, PLLC

(57) ABSTRACT

In an embodiment, a Group III nitride device includes a multilayer Group III nitride structure and a first ohmic contact arranged on and forming an ohmic contact to the multilayer Group III nitride device structure. The first ohmic contact includes a base portion having a conductive surface, the conductive surface including a peripheral portion and a central portion, the peripheral portion and the central portion being substantially coplanar and being of differing composition, a conductive via positioned on the central portion of the conductive surface and a contact pad positioned on the conductive via.

20 Claims, 7 Drawing Sheets

(51) Int. Cl.
    *H01L 21/283*     (2006.01)
    *H01L 29/40*     (2006.01)
    *H01L 29/778*     (2006.01)

(58) Field of Classification Search
    USPC .......................................................... 257/194
    See application file for complete search history.

(56) References Cited

U.S. PATENT DOCUMENTS

| | | |
|---|---|---|
| 2010/0270559 A1 | 10/2010 | Ota |
| 2011/0248283 A1 | 10/2011 | Cao et al. |
| 2013/0126884 A1 | 5/2013 | Romano et al. |
| 2013/0341679 A1 | 12/2013 | Green et al. |
| 2015/0001721 A1* | 1/2015 | Nishi .................. H01L 29/2003 438/653 |
| 2015/0243657 A1 | 8/2015 | Lin et al. |
| 2016/0126319 A1 | 5/2016 | Ogino |
| 2018/0240753 A1 | 8/2018 | Laroche et al. |

FOREIGN PATENT DOCUMENTS

| | | |
|---|---|---|
| EP | 2747147 A2 | 6/2014 |
| JP | 2006173241 A | 6/2006 |
| KR | 20080063062 A | 7/2008 |
| WO | 2005057624 A2 | 6/2005 |
| WO | 2008027593 A2 | 3/2008 |

* cited by examiner

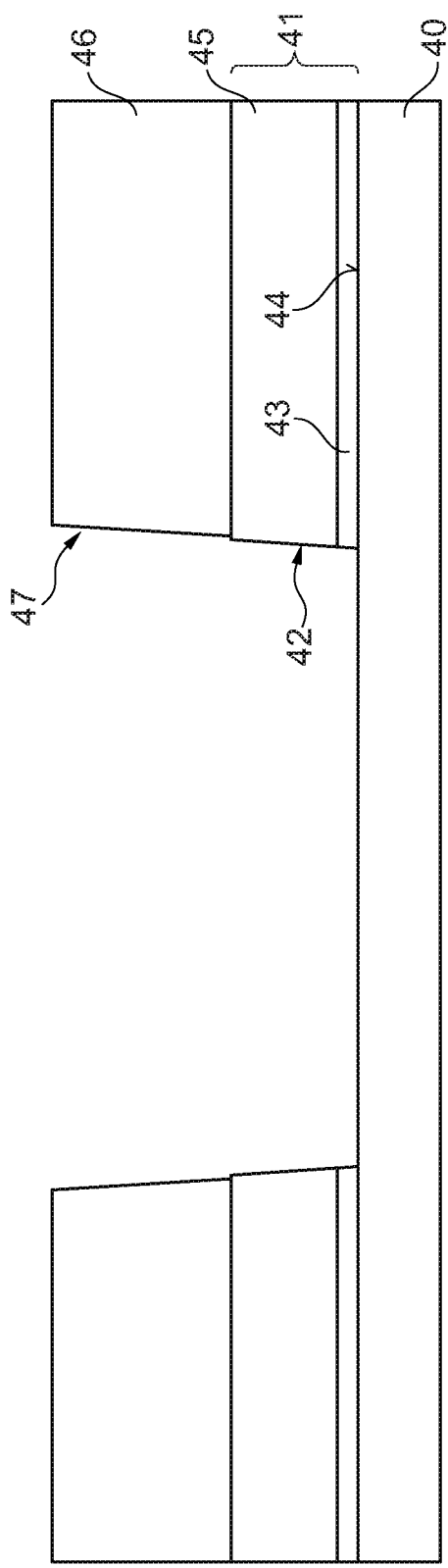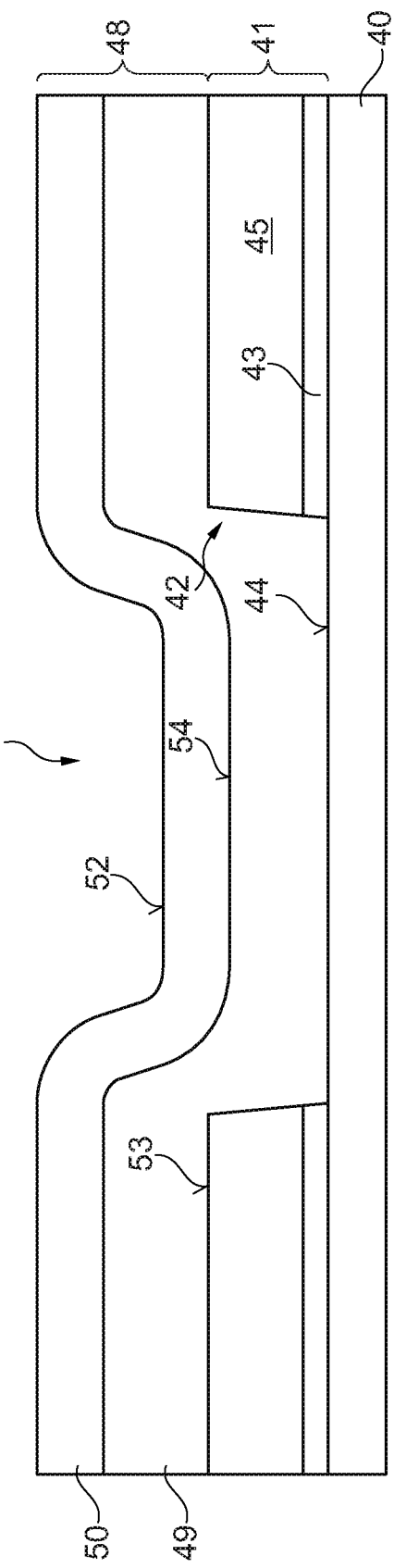

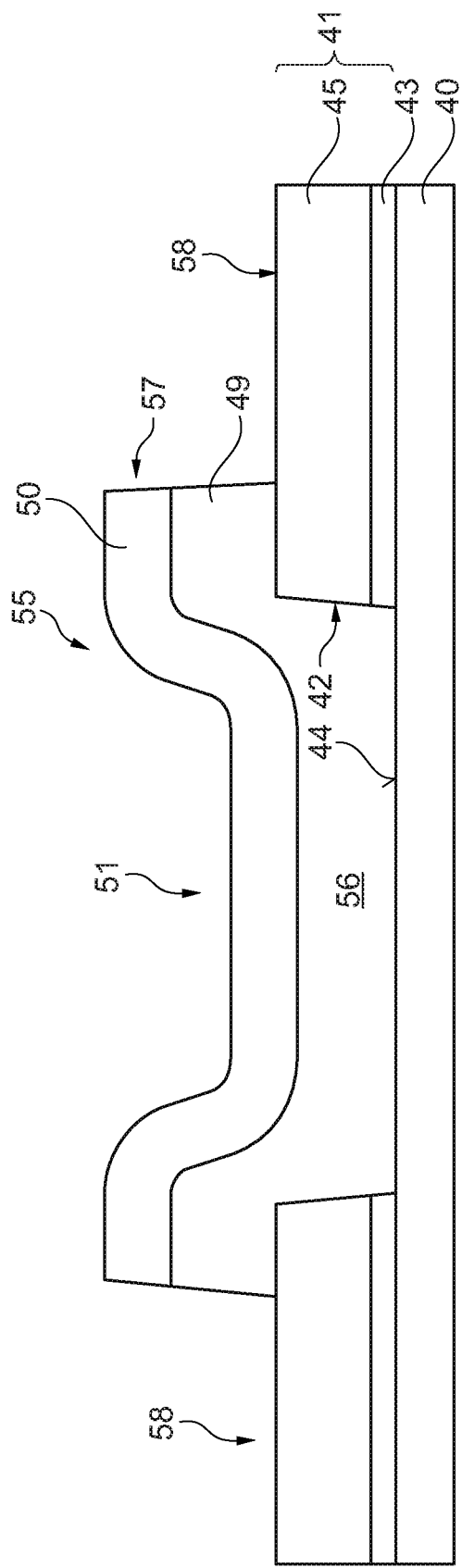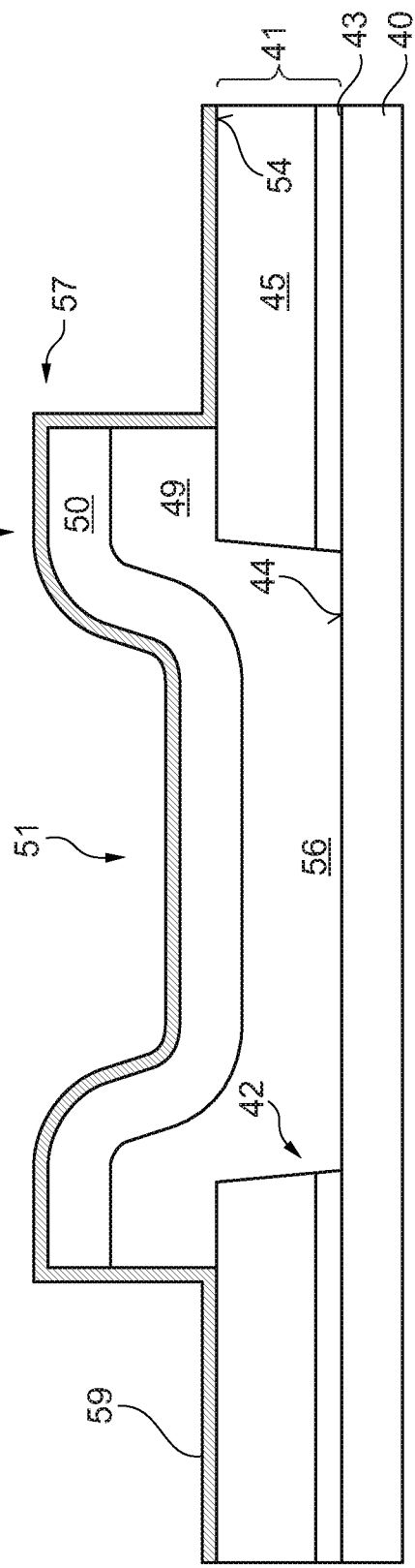

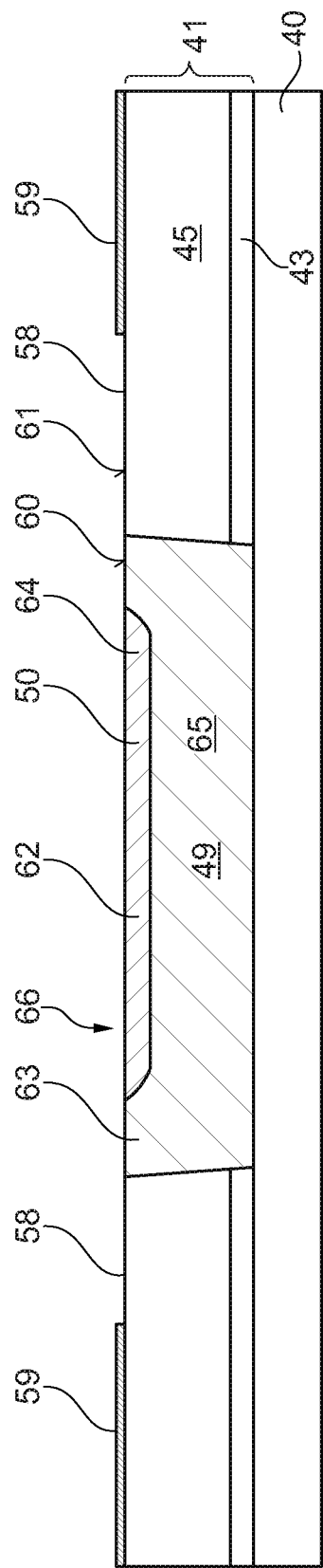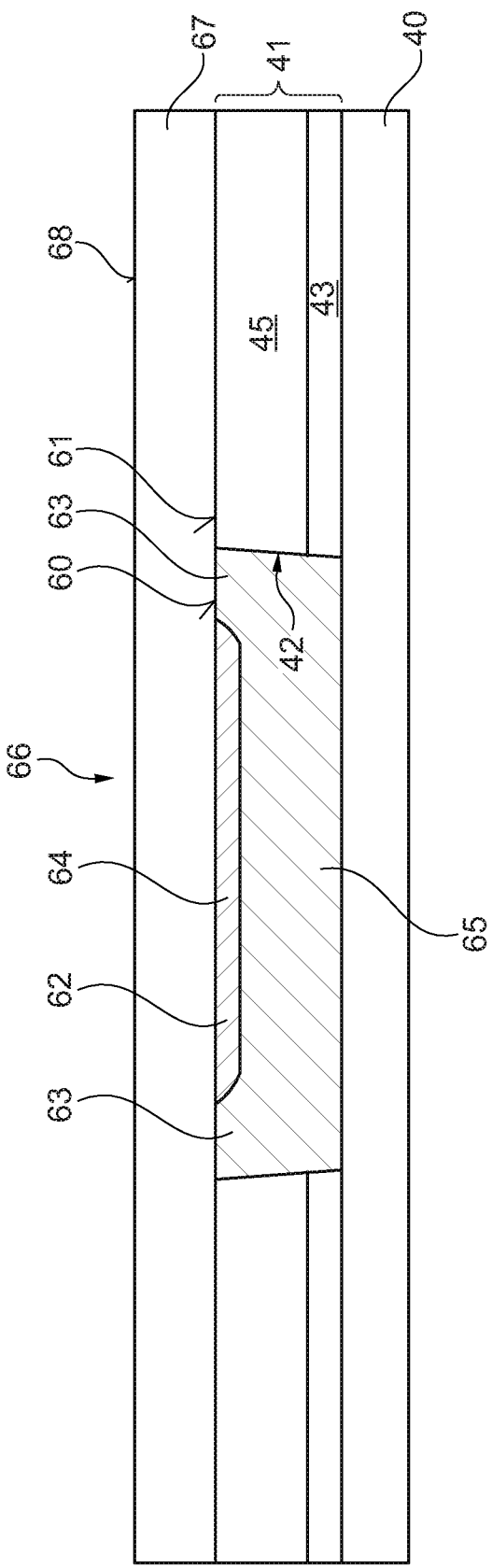
Fig. 2E
Fig. 2F

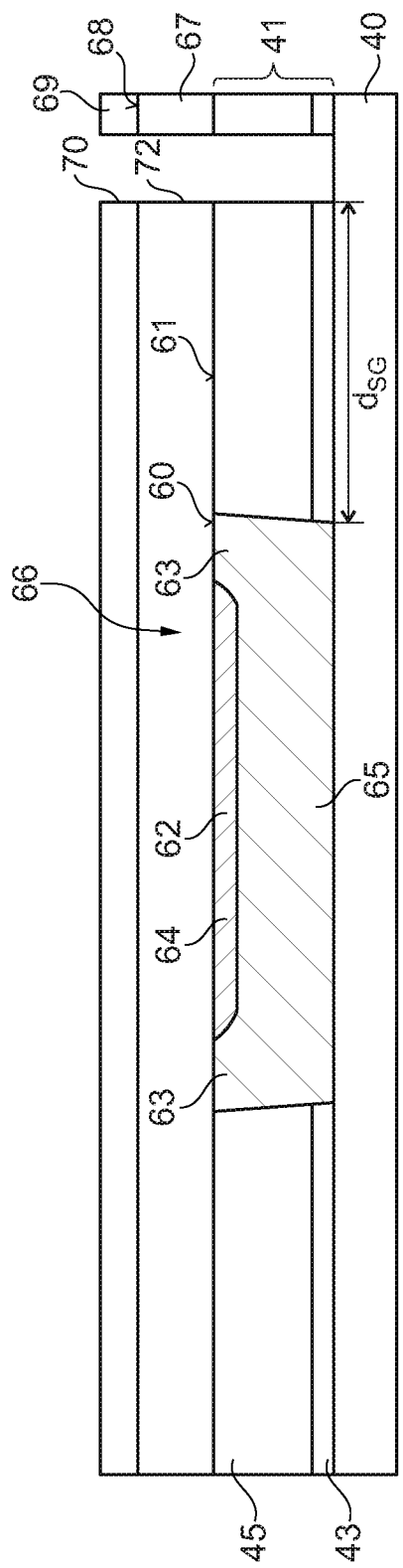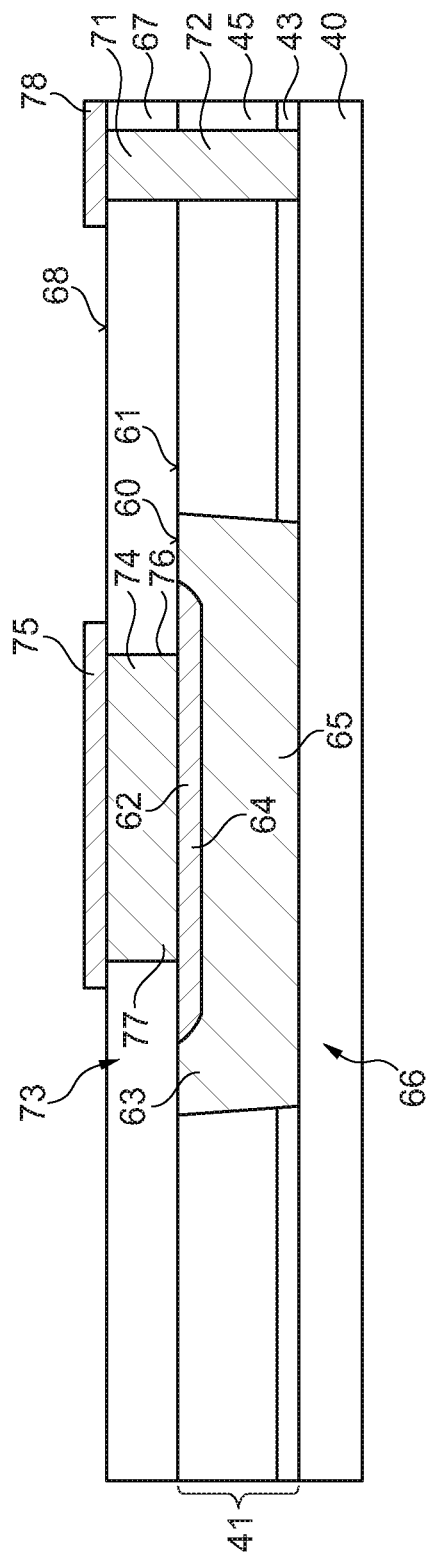

GROUP III NITRIDE DEVICE HAVING AN OHMIC CONTACT

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times. Further improvements to Group III nitride-based devices, are, however desirable.

SUMMARY

In an embodiment, a Group III nitride device comprises a multilayer Group III nitride structure and a first ohmic contact arranged on and forming an ohmic contact to the multilayer Group III nitride device structure. The first ohmic contact comprises a base portion having a conductive surface, the conductive surface comprising a peripheral portion and a central portion, the peripheral portion and the central portion being substantially coplanar and being of differing composition. The first ohmic contact further comprises a conductive via positioned on the central portion of the conductive surface and a contact pad positioned on the conductive via.

In an embodiment, a method of fabricating an ohmic contact for a Group III nitride-based device comprises depositing a metallic layer onto a dielectric layer positioned on a Group III nitride layer and into an opening in the dielectric layer and forming a planarised surface. The planarized surface is formed by structuring the metallic layer to form a T-shaped contact having a vertical portion positioned in the opening and a horizontal portion positioned on the dielectric layer with regions of the dielectric layer being exposed to define the lateral extent of the horizontal portion of the T-shaped contact, forming an ohmic contact between the metallic layer and the Group III nitride layer, depositing a stop layer onto outer surfaces of the T-shaped contact and onto the exposed portions of the dielectric layer, progressively removing the horizontal portion of the T-shaped contact and forming a conductive surface that is substantially coplanar with the stop layer positioned on the dielectric layer, and removing the stop layer to produce the planarised surface. The planarised surface comprises material of the dielectric layer and the conductive surface.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 2A to 2H illustrate a method of fabricating an ohmic contact for a Group III nitride-based device.

DETAILED DESCRIPTION

Figure 1:
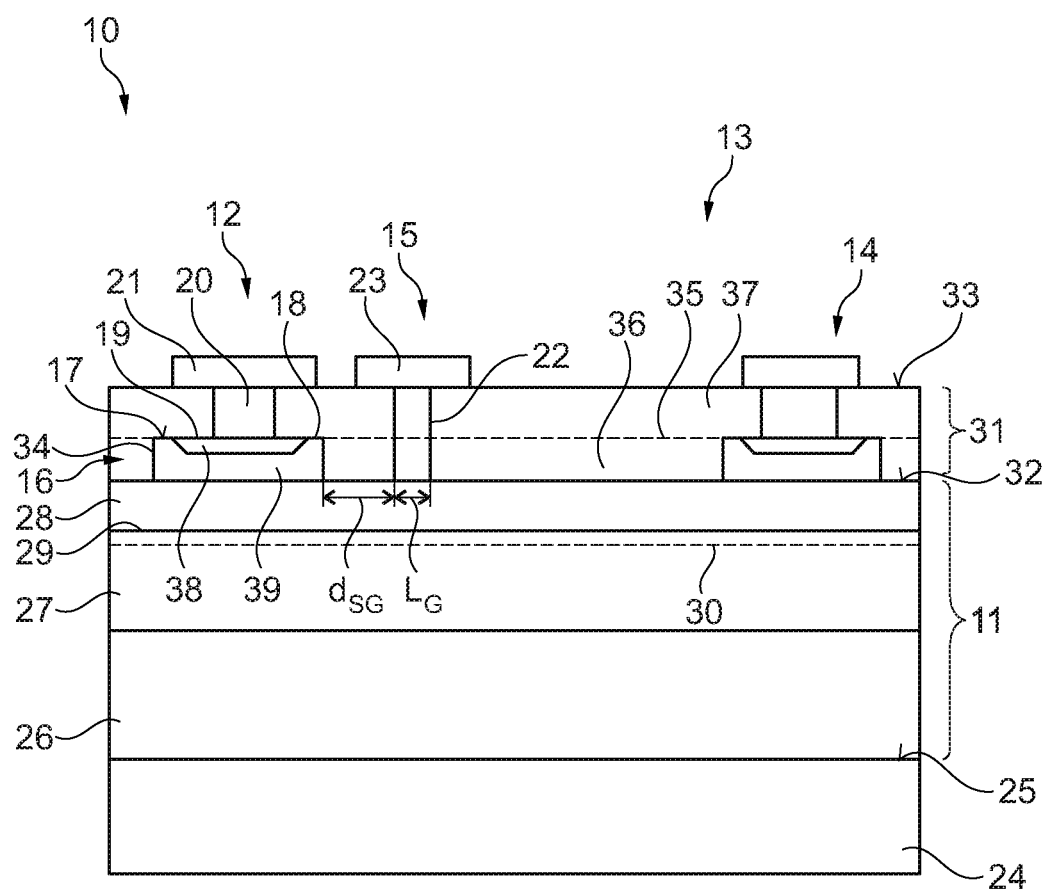
FIG. 1 illustrates a schematic cross-sectional view of a Group III nitride-based device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

Methods for fabricating an ohmic contact for Group III nitride-based devices, such as transistor devices, are disclosed that enable the fabrication of a device with a short gate length Lg, for example Lg≤250 nm, and an optimized feed-back capacitance Cgd. Such short gate lengths are useful for radio-frequency application transistors requiring a high transition frequency fT in the range 50 GHz to 150 GHz. Such short gate lengths can be achieved using high precision patterning for which photolithography processes with thin photo resist flows are required. However, the processing of such photoresists is highly sensitive to topography steps on a wafer, such as steps created by the Ohmic Metal of the source and drain contacts, which is commonly fabricated prior to the gate structure.

This disclosure describes an ohmic metallization concept which leaves no topography steps such as vertical steps due to RIE (Reactive Ion Etching) patterning of the Ohmic metal stack for the source and drain contacts so that photolithography can be applied to form shorter gate lengths and to position the gate more closely to the source contact to reduce $R_{DSON}$. The methods can be carried out using the process capabilities of a 200 mm CMOS production line and, therefore, cost effectively on wafers having a diameter of at least 200 mm.

According to the present disclosure, an Ohmic contact-first approach is used to fabricate a Group III nitride-based device, in particular a transistor device such as a HEMT (High Electron Mobility Transistor). In an embodiment, the method is carried out on a wafer, which may have a diameter of 6 inches or more and includes planarizing the Ohmic metal before the fabrication of the gate structure. The ohmic metal may be formed by opening a window in the Group III nitride passivation, depositing an Ohmic metal stack, structuring the Ohmic metal stack and applying the Ohmic metal anneal step to alloy the ohmic metal. The ohmic metal can be planarized by depositing a CMP (Chemical Mechanical Polishing) stop layer on the frontside of the wafer, using chemical mechanical polishing on the structured Ohmic metal to produce a planarized surface and afterwards stripping the remaining parts of the stop layer. The planarized surface can be used for the further processing of the device, for example to form the gate using photolithography without underlying topography affecting the accuracy of the photolithographic process. Advantages of this approach include enabling of a low gate to source distance to enhance device performance and improving the critical dimension control of the gate process to enhance manufacturability and device performance.

FIG. 1 illustrates a schematic cross-sectional view of a Group III nitride-based device 10 according to an embodiment. The Group III nitride-based device 10 includes a multilayer Group III nitride structure 11 and a first ohmic contact 12 which is arranged on and forms an ohmic contact to the multilayer Group III nitride device structure 11. The Group III nitride-based device 10 may be a transistor device 13 such as a High Electron Mobility Transistor (HEMT). In embodiments in which the Group III nitride device 10 is a transistor device 13, the first ohmic contact 12 may provide a source contact or, in other embodiments, a drain contact.

The first ohmic contact 12 comprises a base portion 16 having a conductive surface 17. The conductive surface 17 has a peripheral portion 18 and central portion 19. The peripheral portion 18 and the central portion 19 are substantially coplanar and are of differing composition. The first ohmic contact 12 further comprises a conductive via 20 positioned on the central portion 19 of the conductive surface 17 and a contact pad 21 positioned on the conductive via 20.

The conductive via 20 of the first ohmic contact 12 is positioned on the central portion 19 of the conductive surface 17 of the base portion 16 of the ohmic contact 12 and has a lateral extent which is less than the lateral extent of the base portion 16. In some embodiments, the lateral extent of the conductive via 20 is less than the lateral extent of the central portion 19 of the conductive surface 17.

The Group III nitride-based transistor device 13 includes a second ohmic contact 14, which provides the drain contact, and a gate contact 15 which is arranged laterally between the source contact 12 and the drain contact 14. In embodiments in which the Group III nitride device 13 includes two or more ohmic contacts 12, 14, each of the ohmic contacts 12, 14 may have the same structure and be fabricated at substantially the same time.

Figure 4:
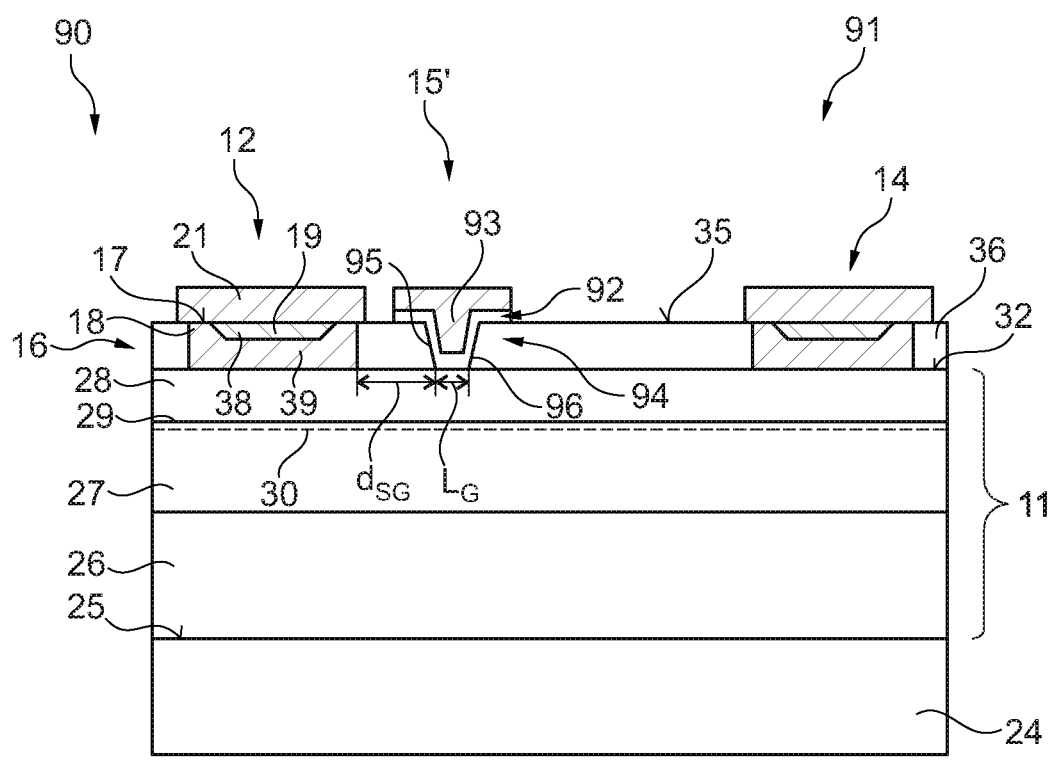
FIG. 4 illustrates a schematic cross-sectional view of a Group III nitride-based device according to an embodiment.

In the embodiment illustrated in FIG. 1, the second ohmic contact 14 providing the drain contact has the same structure as the first ohmic contact 12 and will not be described separately. In the embodiment illustrated in FIG. 1, the gate contact 15 includes a via 22 which is positioned on the Group III nitride-based structure 11 and a gate contact pad 23 which is positioned on the gate conductive via 22. The gate contact 15 may be a Schottky contact. In other embodiments, the transistor device includes an insulated gate contact, for example as illustrated in FIG. 4.

The multilayer Group III nitride structure 11 is positioned on a support substrate 24 which has a growth surface 25 which is capable of supporting the epitaxial growth of at least one Group III nitride layer. The support substrate 24 may be monocrystalline silicon substrate, for example a <111> or <110> silicon wafer or a monocrystalline sapphire substrate.

The multilayer Group III nitride structure 11 may include a Group III nitride buffer structure 26 arranged on the growth surface 25, a Group III nitride channel layer 27 arranged on the Group III nitride buffer structure 26 and a Group III nitride barrier layer 28 arranged on the Group III nitride channel layer 27. The Group III nitride barrier layer 28 has a different composition and bandgap to the Group III nitride channel layer 27 such that a heterojunction 29 is formed therebetween. For example, the Group III nitride channel layer 27 may comprise gallium nitride and the Group III nitride barrier layer 28 may comprise aluminum gallium nitride. The heterojunction 29 is capable supporting a two-dimensional charge gas which is indicated schematically in the in FIG. 1 by the dashed line 30. The first ohmic contact 12 and the second ohmic contact 14 form an ohmic contact with the two-dimensional charge gas 30.

A typical buffer structure 26 for a silicon substrate includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer of AlGaN back barrier is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

The Group III nitride device 10 further includes a dielectric layer 31 arranged on an upper surface 32 of the multilayer Group III nitride structure 11 and, in the embodiment illustrated in FIG. 1, on the upper surface of the Group III barrier layer 28. The conductive via 20 of the first ohmic contact 12 extends from an upper surface 33 of the dielectric layer 31 to the conductive surface 17 and the contact pad 21 is positioned on the upper surface 33 of the dielectric layer 31. The dielectric layer 31 also covers at least the peripheral portion 18 of the conductive surface 17 as well as side faces 34 of the base portion 16 and regions of the central portion 19 which are uncovered by the conductive via 20.

The gate conductive via 22 extends from the upper surface 33 to the upper surface 32 of the Group III nitride structure 11. In some embodiments, the base of the gate contact 15 may be positioned within the thickness of the Group III nitride barrier layer 28.

As is indicated by the dotted line 35 in FIG. 1, the dielectric layer 31 includes two sublayers. The lower sublayer 36 is positioned on the upper surface 32 of the multilayer Group III nitride structure 11 and, during manufacture of the Group III nitride-based device 10, formed a planar surface with the conductive surface 17 of the base portion 16 of the first ohmic contact 12 before the deposition of the upper sublayer 37. The lower and upper sublayers 36, 37 may have the same composition, for example silicon oxide, and may be formed using a TEOS process. In some embodiments, the dielectric layer 31 includes more than two sublayers. For example, a further sublayer may be positioned between the upper surface 32 of the multilayer Group III nitride structure 11 and the lower sublayer 36 which may have a different composition to the lower sublayer 36. For example, this further sublayer may include silicon nitride.

The formation of this planarised surface 35 enables the gate contact 15 to be formed using photolithographic techniques, whereby the photoresist mask and deposition processes for fabricating at least a base portion of the gate structure can be carried out on this planarised surface 35 before fabrication of the ohmic contacts 12, 14 is completed. For example, at least a base portion of the gate structure can be fabricated before fabrication of the conductive via 20 and contact pad 21.

This method enables the photoresist layer for the gate to be more accurately structured, since it is formed on a planar surface and can be formed after the ohmic contact is formed between the base portion 16 and the multilayer Group III structure 11. As a result of the more accurate structuring of the photoresist layer, the dimensions and position of the gate can be more accurately controlled. This enables the distance $d_{SG}$ between the ohmic source contact 12 and the gate contact 15, as measured at the base of the ohmic contact 12 and gate contact 15, to be reduced and to be reliably produced at this reduced length. The gate to source distance may be less than 0.5 μm, for example 250 nm or less in order to lower $R_{DSON}$ and enhance device performance.

Additionally, the critical dimension control of the gate process is improved to enhance manufacturability and device performance. The gate length $L_G$ may also be less than 0.5 μm, for example 250 nm or less. This high precision patterning of the gate electrode is enabled as the photoresist processes of the gate are not affected by topography steps created by the Ohmic metal contacts 12, 14, in particular the base portion 16 formed directly before the gate electrode 15 due to the formation of the planarized surface 35 after the formation of the base portion 16. Such topography steps would impair the local uniformity of the involved anti-reflection-coating and resist coating processes and would degrade the depth-of-focus of the lithographic exposure process. In effect the control of small dimension lithographic structures would be severely limited.

As discussed above, in some embodiments, the conductive surface 17 includes two regions 18, 19 of differing composition that are coplanar. The central portion 19 and peripheral portion 18 may be provided as the upper surface of a base portion 16 that includes a well 38 comprising a metal or alloy of a first composition extending into a lower portion 39 comprising a metal or alloy of a second different composition. The upper surface of the well 38 provides the central portion 19 of the conductive surface 17 and the upper surface of the lower portion 38 provides the peripheral portion 18 of the conductive surface 17, so that the upper surface of the well 38 and the upper surface of the lower portion 39 are substantially coplanar.

The well 38 and the central portion 19 of the conductive surface 17 comprise a conductive barrier material and the lower portion 39 and peripheral portion 18 comprise an ohmic contact material. An ohmic contact material is material which forms an ohmic contact to the Group III nitride material of the uppermost Group III nitride layer of the multilayer Group III nitride structure 11. In some embodiments, the conductive barrier material of the well 38 and the central portion 19 of the conductive surface 17 comprise titanium nitride and the lower portion 39 and peripheral portion 38 of the conductive surface 17 comprise aluminum or aluminum copper alloy or a titanium aluminum alloy.

The gate contact 15 may be a Schottky gate such that the base of the conductive via 22 is formed of metal or alloy that forms a Schottky gate to the uppermost layer of the Group III nitride structure 11. In other embodiments, the gate contact 15 may be an insulated gate contact.

The base portion 16 of the ohmic contacts 12, 14 and the lower portion of the gate contact 15 may be referred to as electrodes, i.e. source electrode, gate electrode and drain electrode.

A method of fabricating an ohmic contact, such as the one of the ohmic contacts 12, 14 of the transistor device 13 illustrated in FIG. 1, will now be described with reference to FIGS. 2A to 2H.

FIG. 2A illustrates a cross-sectional view of a portion of a Group III nitride-based layer 40 which may be an uppermost portion of a multilayer Group III nitride structure, such as the aluminum gallium barrier layer 28 of the Group III nitride layer structure 11 illustrated in FIG. 1. The Group III nitride-based layer 40 may be arranged on a support substrate which is not illustrated in FIGS. 2A to 2H. The Group III nitride layer 40 and support substrate may have a diameter of at least 200 mm and include a plurality of device positions, whereby each device position includes one or more ohmic contacts that are fabricated alongside the fabrication of the single ohmic contact that is described in connection with FIGS. 2A to 2H.

A dielectric layer 41 is positioned on the Group III nitride layer 40. In some embodiments, the dielectric layer 42 includes two sublayers, a first sublayer 43 arranged the upper surface 44 of the Group III nitride layer 40 and a second sublayer 45 arranged on the first sublayer 43. In some embodiments, the first sublayer 43 may include silicon nitride and the second sublayer 45 may include silicon oxide. The dielectric layer 41 may provide the dielectric layer 31 and, in particular, the dielectric sublayer 36 of the device 10 illustrated in FIG. 1.

In opening 42 an ohmic contact is formed in the dielectric layer 41 and a region of the Group III nitride layer 40 is exposed. The opening 42 in the dielectric layer 41 may be fabricated by forming a photoresist layer 46 on the dielectric layer 41, forming an opening 47 in the photoresist layer 46 and removing the dielectric layer 41 exposed in the opening 47 in the photoresist layer 46 and exposing the Group III nitride layer 40. The material of the dielectric layer 41 exposed in the opening 47 in the photoresist layer 46 may be removed by dry etching, for example reactive ion etching, wet chemical etching or a combination of etching processes. A combination of etching processes may be used in embodiments in which the dielectric layer 41 includes sublayers of differing materials, as a suitable etching process can be selected for each material. The photoresist layer 46 is then removed.

As is illustrated in FIG. 2B, a metallic layer 48 is deposited onto the dielectric layer 41 and into the opening 42. The opening 42 may be completely filled with the metallic layer 48. In some embodiments, the metallic layer 48 includes two or more sublayers. For example, a lower sublayer 49 may comprise a metal or alloy for forming an ohmic contact to the Group III nitride layer 40 as the lower sublayer 49 is in direct contact with the Group III nitride layer 40. An upper sublayer 50 may comprise a conductive barrier layer. In some embodiments, the conductive barrier sublayer 50 includes titanium nitride and the lower sublayer 49 includes aluminum, and aluminum copper alloy or a titanium aluminum alloy. In other embodiments, the metallic layer 48 includes three or more sublayers. For example, in addition to the sublayers 49, 50, a lowermost titanium layer may be deposited which acts as an adhesion layer to improve the adhesion between the material of the overlying ohmic contact sublayer 49 and the dielectric layer 41 and the Group III nitride layer 40.

The metallic layer 48, including any sublayers, may be deposited using Physical Vapour Deposition. In some embodiments, the metallic layer 48 may be conformally deposited such that the outer surface includes an indentation 51 positioned above the opening 42. The uppermost surface 52 of the metallic layer 48 is positioned in a plane above the upper surface 53 of the dielectric layer 41. The thickness of the various sublayers may be selected such that the upper surface 54 of the ohmic contact material sublayer 49 is positioned within the opening 42 in a plane below the upper surface 53 of the dielectric layer 41. The uppermost surface 52 of the conductive barrier sublayer 50 is positioned in a plane above the upper surface 53 of the dielectric layer 41.

A planarised surface is now formed which comprises the material of the dielectric layer 41 and the metallic layer 48. The planarised surface may be formed using a two-step process.

As is illustrated in FIG. 2C, in a first step of the planarization process, the metallic layer 48 is laterally structured to form a T-shaped contact 55 having a vertical portion 56 positioned in the opening 42 in the dielectric layer 41 and a horizontal portion 57 positioned on the dielectric layer 41. The metallic layer is removed from the dielectric layer 41 so that regions 58 of the dielectric layer 41 are exposed from the metallic layer 48 and define the lateral extent of the horizontal portion 57 of the T-shaped contact 55. This lateral structuring of the metallic layer 48 to from the T-shaped contact 55 may be carried out by applying a photoresist, structuring the photoresist layer and removing exposed portions of the metallic layer 48 in regions adjacent the opening 42, for example by reactive ion etching to expose the regions 58 of the dielectric layer 41.

The T-shaped contact 55 may then be treated to form an ohmic contact between the T-shaped contact 55 and the Group III nitride structure 11. For example, the assembly may be subjected to heat.

In a second step of the planarization process, the metallic layer 48 is vertically structured. As illustrated in FIG. 2D, a continuous stop layer 59 of e.g. 20-50 nm thickness is deposited onto outer surfaces of the T-shaped contact 55 and onto the exposed portions 58 the dielectric layer 41. The horizontal portion 57 of the T-shaped contact 55 is progressively removed, reducing the height of the remainder of the metallic layer 48 so as to form a conductive surface 60 which is substantially coplanar with the stop layer 59 which is positioned on the dielectric layer 41 in regions 58 adjacent to the T-shaped contact 55. The horizontal portion 57 may be progressively removed using chemical mechanical polishing, for example.

Due to the shape of the T-shaped contact 55 and, in particular, the raised peripheral edges of the horizontal portion 57 adjacent the indentation 51, the raised peripheral portions are first removed by the chemical mechanical polishing process as the slurry preferentially removes the portions of the stop layer 59 arranged on the peripheral portions and exposed edges of the horizontal portion 57. The chemical mechanical polishing process affects the stop layer 59 to a lesser degree in the large area lateral regions of the stop layer 59 positioned on the dielectric layer 41, as is illustrated in FIG. 2E, so that these regions act as a stop layer 59 in the CMP process and enable the production of a planarised surface 61. The remaining portions of the stop layer 57 positioned on the dielectric layer 41 laterally adjacent to the conductive surface 60 may be removed to produce the planarised surface 61 including material of the dielectric layer 41 and the conductive surface 60.

In some embodiments, the conductive surface 60 includes a central portion 62 comprising the material of the upper sublayer 50 and a peripheral portion 63 comprising material of lower sublayer 49. The conductive surface 60 therefore includes two regions of differing composition that are substantially coplanar. In embodiments in which the ohmic contact has a strip-like form, the peripheral portion 63 is positioned on two opposing laterally sides of the central portion 62. In embodiments in which the elements of Ohmic metal are used for lithographic alignment of a secondary layer to the Ohmic metal as a primary layer, the central portion 62 and the peripheral portions 63 may be vertically offset with respect to one another to create a suitable alignment mark.

The central portion 62 of the conductive surface 60 may be the upper surface of a well-type structure 64 comprising the conductive barrier material which extends into a lower portion 65 comprising the material of the second lower sublayer 49 of the metallic layer 48. The metallic structure illustrated in FIG. 2E may be used as a base portion 66 of an ohmic contact. The base portion 66 may provide the base portion 16 of the ohmic contacts 12, 14 in the Group III nitride-based device 10 illustrated in FIG. 1, for example.

The planarised surface 61 includes one or more discrete conductive regions provided by the conductive surface 60 of the base portion 66 and the upper surface 68 of the further dielectric layer 67. The side faces of the base portion 66 are embedded in the dielectric layer 67. The upper surface 68 and conductive surface 60 are substantially coplanar. This composite layer is supported on the Group III nitride layer 40 which in turn may be supported on a substrate, such as a monocrystalline wafer.

In some embodiments, after the horizontal portion 57 has been removed, the stop layer 59 is arranged on at least a region of the central portion 62 of the conductive surface 60 as well as on the regions 58 of the dielectric layer 41. The peripheral portion 63 of the conductive surface 60 is exposed from the stop layer 59.

As illustrated in FIG. 2F, a further dielectric layer 67 may be deposited onto the planarised surface 61. The dielectric layer 67 may form part of a metallisation structure which is built up on top of the Group III nitride layer 40, for example for the dielectric sublayer 37 of the dielectric layer 31 in the Group III nitride-based device 10 illustrated in FIG. 1, or may act as a temporary protective layer. As the further dielectric layer 67 is deposited on the planarised surface 61, the upper surface 68 of the dielectric layer 67 is also substantially planar, as illustrated in FIG. 2F.

The planarised surface 61 and substantially planar upper surface 68 of the further dielectric layer 67 can be used to assist in increasing the accuracy of the photolithographic processes applied to the upper surface 68. These photolithographic processes may be used to form a further non-ohmic contact such as a gate contact, and/or metallization layers for providing a redistribution structure, and/or completion of the structure of the ohmic contact on the base portion 66.

In some embodiments, the method continues with the further formation of an upper portion of the ohmic contact on the base portion 66 described below with reference to FIG. 2H. In embodiments in which the Group III nitride device comprises a further non-ohmic contact such as a gate contact, at least a lower portion of the gate contact may be formed next, as illustrated in FIG. 2G, and afterwards the upper portion of the ohmic contact is formed, as described below with reference to FIG. 2H.

Before formation of a further non-ohmic contact, such as a gate contact, the base portion 66 may be treated to form an ohmic contact to the Group III nitride layer 40 or to decrease the contact resistance of the connection between the base portion 66 and the Group III nitride layer 40.

As is illustrated in FIG. 2G, after the formation of the base portion 66 of the ohmic contact, a further non-ohmic contact such as the gate contact 15 of the Group III nitride-based device 10, can be formed by forming a second photoresist layer 69 on the further dielectric layer 67. The second photoresist layer 69 is structured so as to form a second opening or via 70 positioned laterally adjacent the conductive surface 60 and base portion 66. A portion of the further dielectric layer 67 is exposed at the base of the opening 70. The further dielectric layer 67 and the underlying dielectric layer 41 are removed to form a via 72 and expose a portion of the Group III nitride layer 40 at the base of the via 72 that is positioned laterally adjacent the base portion 66. The material of the further dielectric 67 and the dielectric layer 41 exposed in the opening 70 in the photoresist layer 69 may be removed by dry etching, for example reactive ion etching, wet chemical etching or a combination of etching processes.

In some embodiments, such as that illustrated in FIG. 2H, conductive material 71 is inserted into the via 72 to form a gate contact to the Group III nitride layer 40. The conductive material 71 may include one or more metals or alloys and may include one or more sublayers. The composition of the conductive material 71 may be selected such that a Schottky contact to the Group III nitride layer 40 is produced. This embodiment can be used to fabricate a Schottky gate.

A gate contact pad 78 is formed on the conductive material 71 positioned in the via 72 that extends onto the upper surface 68 of the further dielectric layer 67 in regions adjacent to the via 72. The gate contact pad 78 may provide the gate contact pad 23 and the conductive material 71 the conductive via 22 in the Group III nitride-based device 10.

As also illustrated in FIG. 2H, the upper portion 73 of the ohmic contact 12 including a conductive via 74 and a contact pad 75 may be formed on the base portion 66. A third photoresist layer may be formed on the further dielectric layer 67 and a third opening formed in the third photoresist layer above the base portion 66. The further dielectric layer 67 is removed to form a via 76 in the dielectric layer 67 such that at least a region of the central region 62 of the conductive surface 60 of the base portion 66 is exposed at the base of the via 76. The material of the further dielectric layer 67 exposed in the third opening in the third photoresist layer may be removed by dry etching, for example reactive ion etching, wet chemical etching or a combination of etching processes.

Conductive material 77 is deposited into the via 76 to form the conductive via 74. The conductive material 77 may also be deposited onto the upper surface 68 of the further dielectric layer 67 in regions adjacent the via 76 to form the contact pad 75 which is positioned on the conductive via 74 and electrically connected to the base portion 66. The contact pad 75 forms an ohmic connection to the Group III nitride layer 40 and it's two-dimensional charge gas.

The base portion 67 of the ohmic contacts 12, 14 and the lower portion 70 of the gate contact 15 may be referred to as electrodes, i.e. source electrode, gate electrode and drain electrode.

High precision patterning to form the gate electrode, in particular the via 70, is enabled as topography steps are not created by the base portion 66 of the Ohmic metal contacts 12, 14 that is formed directly before the gate electrode due to the formation of the planarized surface 61 after the formation of the base portion 66 of the ohmic contacts 12, 14. The gate to source distance $d_{SG}$ may be less than 0.5 µm, for example 250 nm or less which enhances device performance and lowers $R_{DSON}$. Additionally, the critical dimension control of the gate process is improved so that manufacturability and device performance are improved. The gate length $L_G$ may also be reduced to less than 0.5 µm, for example 250 nm or less.

Figure 3:
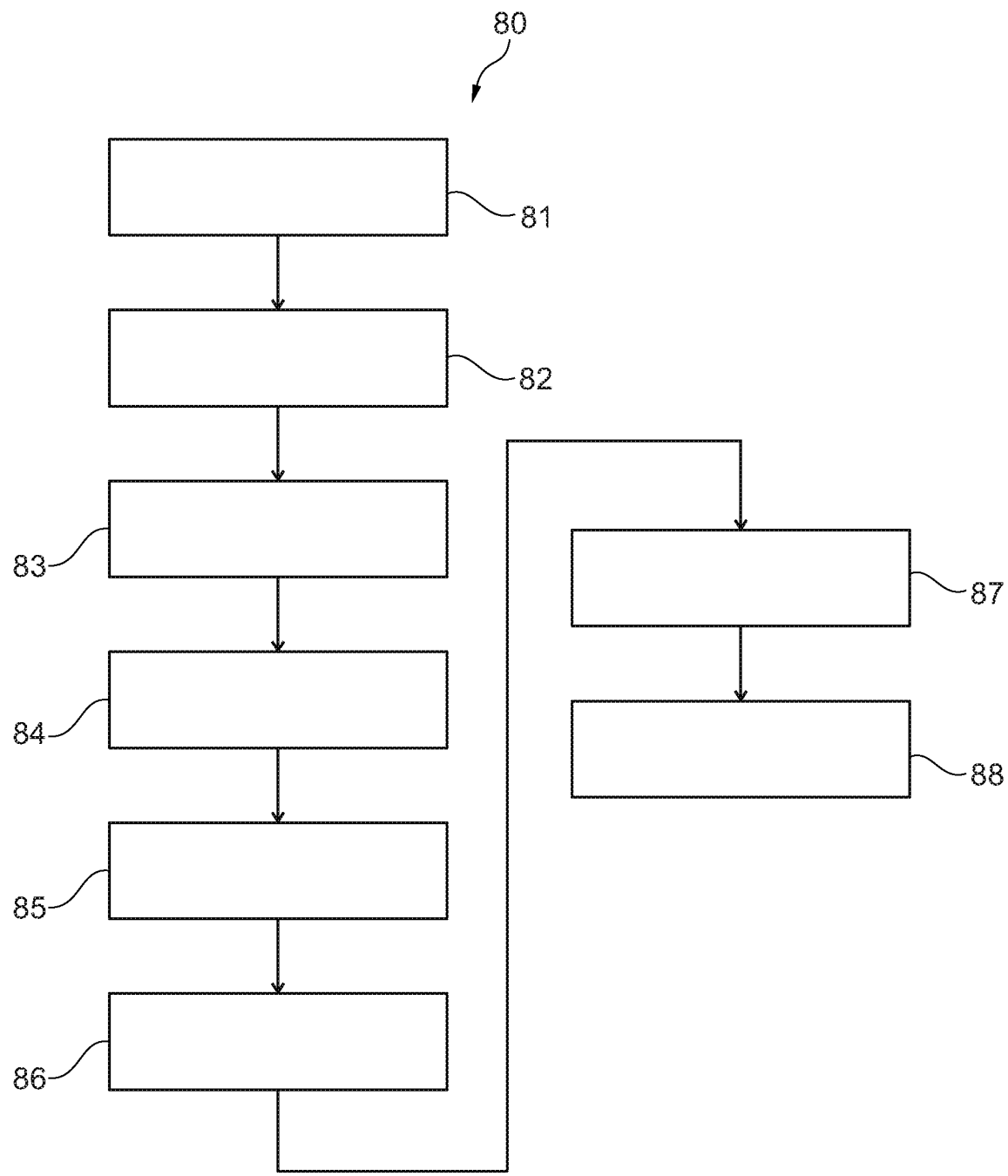
FIG. 3 illustrates a flowchart of a method for fabricating an ohmic contact for a Group III nitride-based device.

FIG. 3 illustrates a flow chart 80 of a method of fabricating an ohmic contact for a Group III nitride-based device. In block 81, a metallic layer is deposited onto a dielectric layer positioned on a Group III nitride layer and into an opening in the dielectric layer. A planarised surface is then formed by performing the method described in blocks 82 to 88. In block 82, the metallic layer is structured to form a T-shaped contact having a vertical portion positioned in the opening and a horizontal portion positioned on the dielectric layer with regions of the dielectric layer being exposed to define the lateral extent of the horizontal portion of the T-shaped contact. In block 83, an ohmic contact between the metallic layer and the Group III nitride layer is formed, for example by thermal annealing. In block 84, a stop layer is deposited onto outer surfaces of the T-shaped contact and onto the exposed portions of the dielectric layer. In block 86, the horizontal of the T-shaped contact is progressively removed, for example by chemical mechanical polishing and in block 87 a conductive surface is formed that is substantially coplanar with the stop layer positioned on the dielectric layer. In block 88, the stop layer is removed to produce the planarised surface, the planarised surface comprising material of the dielectric layer and the conductive surface.

In some embodiments, the structuring the metallic layer comprises forming a photoresist layer on the metallic layer, structuring the photoresist layer by exposure with a photo mask and subsequent development, removing portions of the metallic layer exposed from the photoresist layer to expose the regions of the dielectric layer and removing the photoresist layer.

In some embodiments, the progressively removing the horizontal portion of the T-shaped contact comprises chemical mechanical polishing.

In some embodiments, the metallic layer comprises a multilayer metallic structure. An outermost layer of the multilayer metallic structure is a conductive barrier layer. After formation of the planarised surface, the conductive surface has a central portion comprising the conductive barrier layer and a peripheral portion comprising an ohmic contact material.

In some embodiments, the conductive barrier layer is TiN and the ohmic contact material comprises aluminum or an aluminum copper or titanium aluminum alloy.

In some embodiments, after the horizontal portion is progressively removed, the stop layer is arranged in addition to the dielectric layer also on the central portion of the conductive surface. The peripheral portion of the conductive surface is exposed from the stop layer.

In some embodiments, to form the opening in the dielectric layer into which the metallic layer is deposited, the method further comprises forming a photoresist layer on the dielectric layer, forming an opening in the photoresist layer, removing the dielectric layer exposed in the opening in the photoresist layer and exposing the Group III nitride layer. The photoresist layer is then removed, and the method proceeds as described in block 81.

In some embodiments, the method further comprises forming a further dielectric layer on the planarised surface. The further dielectric layer may provide a protective layer and/or form part of a metallization structure formed on top of the planarised surface.

In embodiments in which each device includes two or more ohmic contacts, the two or more ohmic contacts are fabricated at substantially the same time in the method described by the flowchart 80.

In some embodiments, the method further comprises forming a gate contact. The gate contact may be formed by forming a second photoresist layer on the further dielectric layer, forming a second opening in the photoresist layer laterally adjacent the conductive surface and exposing a second portion of the further dielectric layer, removing the further dielectric layer and exposing a portion of the Group III nitride layer, inserting conductive material into the second opening and forming a gate contact to the Group III nitride layer.

The gate contact may be a Schottky gate and the conductive material is in direct contact with the Group III nitride structure. The conductive material may be selected to form a Schottky contact with the Group III nitride material. The gate contact may be an insulated gate in which case an insulating layer, for example an oxide, is deposited into and lines the opening in the further dielectric layer and the exposed portion of Group III nitride layer and a conductive material, for example a metal or alloy, is deposited onto the insulating layer.

In some embodiments, the method further comprises forming a contact pad for the ohmic contact. The contact pad for the ohmic contact may be formed after the formation of a gate electrode on the Group III nitride layer for the gate contact. The method may further comprise forming a third opening in the further dielectric layer and exposing a portion of the conductive surface, and depositing conductive material into the third opening to form a conductive via and onto the further dielectric layer to form a contact pad for the ohmic contact.

FIG. 4 illustrates a schematic cross-sectional view of a Group III nitride device 90 which includes a Group III nitride-based transistor 91.

As in the embodiment illustrated in FIG. 1, the Group III nitride device 90 includes a multilayer Group III nitride structure 11 including a Group III nitride buffer structure 26, a Group III nitride channel layer 27 and a Group III nitride barrier layer 28 epitaxially grown on the growth surface 25 of the support substrate 24. The Group III nitride transistor device 91 includes a first ohmic contact 12 forming the source contact, a second ohmic contact 14 providing the drain contact and a gate contact 15' which are arranged on the upper surface 32 of the multilayer Group III nitride structure 11. In this embodiment the gate 15' includes an insulated gate structure in place of the Schottky gate structure of the gate 15 in the Group III nitride-based device 10 illustrated in FIG. 1.

The gate 15' is positioned laterally between the first ohmic contact 12 providing the source and the second ohmic contact 14 providing the drain of the Group III nitride transistor 91. The gate contact 15' is positioned nearer to the source than to the drain. As in the embodiment illustrated in FIG. 1, each of the first ohmic contact 12, the second ohmic contact 14 and the gate contact 15' may have a strip-like form extending into the plane of the drawing and be arranged substantially parallel to one another.

Each of the ohmic contacts 12, 14 has the structure illustrated in FIG. 1 with a base portion 16 having a conductive surface 17 comprising a central portion 19 and peripheral portion 18 which are substantially coplanar and of differing composition. The base portion 16 comprises a well 38 comprising a conductive barrier material, for example titanium nitride, that extends into a lower portion 39 which includes a metal or alloy providing an ohmic contact to the two-dimensional charge gas formed at the heterojunction 27 between the Group III nitride channel layer 26 and Group III nitride barrier layer 28. The lower portion may include aluminum, an aluminum copper alloy or a titanium aluminum alloy. The gate 15' has an insulated gate structure including gate insulation 92 positioned between a conductive gate 93, which may be a metal or an alloy, and the upper surface 32 of the Group III nitride barrier layer 28.

The base portion 16 is formed in the dielectric layer 36 such that the conductive surface 17 and upper surface 35 of the dielectric layer 36 are substantially coplanar. A photoresist layer is applied to the planarised surface 35 and structured to from an opening in the photoresist layer for the gate, the opening being arranged laterally between the base portion 65 of the source contact 12 and of the drain contact 14. The portion of the dielectric layer 36 exposed in the opening of photoresist layer is removed to expose the Group III nitride layer 28.

In this embodiment, an insulating layer 92 is deposited into the opening 94 in the dielectric layer 36 such that it lines the sidewalls 95 of the opening 94 formed by the dielectric layer 36 and the base 96 formed by the Group III nitride barrier layer 28. The gate metal 93 is formed on the gate insulation layer 92 formed in the opening 94 to complete the insulated gate structure. The gate metal 93 may include one or more sublayers. The base 96 of the gate 15' may be positioned on the upper surface 32 of the Group III nitride barrier layer 28 or may protrude into the Group III nitride barrier layer 28 such that the thickness of the Group III nitride barrier layer 28 directly under the gate is reduced compared to the thickness of the Group III nitride layer 28 laterally adjacent to the gate.

The planarised surface 35 enables the gate 15' to be positioned accurately and reliably at a short distance, $d_{SG}$, from the base portion 16 of the ohmic source contact 12 by allowing the accurate structuring of a photoresist layer applied to the planarised surface 35. An opening in the photoresist layer for the gate can be formed with closely defined dimensions and in a closely defined position with respect to the base portion 12 of the source contact 12. Consequently, after removal of the portion of the dielectric layer 36 exposed in the opening of photoresist layer, the position of the gate and its distance from the base portion 16, indicated in FIG. 4 as the distance $d_{SG}$, and its length $L_G$ can be reliably produced.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Group III nitride device, comprising:
a multilayer Group III nitride structure; and
a first ohmic contact arranged on and forming an ohmic contact to the multilayer Group III nitride structure;
wherein the first ohmic contact comprises:
a base portion having a conductive surface, the conductive surface comprising a peripheral portion and a central portion, the peripheral portion and the central portion being substantially coplanar and being of differing composition, wherein the central portion comprises TiN;
a conductive via positioned on the central portion of the conductive surface; and
a contact pad positioned on the conductive via.

2. The Group III nitride device of claim 1, further comprising a dielectric layer arranged on the multilayer Group III nitride structure, wherein the conductive via extends from an upper surface of the dielectric layer to the conductive surface, wherein the contact pad is arranged on the upper surface of the dielectric layer, and wherein at least the peripheral portion of the conductive surface is covered by the dielectric layer.

3. The Group III nitride device of claim 2, wherein the dielectric layer covers side faces of the base portion and regions of the central portion of the conductive surface which are uncovered by the conductive via.

4. The Group III nitride device of claim 2, wherein the dielectric layer includes a first sublayer positioned on an upper surface of the multilayer Group nitride structure and a second sublayer positioned on the first sublayer, and wherein an upper surface of the first sublayer is coplanar with the conductive surface of the base portion of the first ohmic contact.

5. The Group III nitride device of claim 1, wherein the base portion comprises a well extending into a lower portion, an upper surface of the well providing the central portion of the conductive surface and an upper surface of the lower portion providing the peripheral portion of the conductive surface, and wherein the well comprises a conductive barrier material and the peripheral portion comprises an ohmic contact material.

6. The Group III nitride device of claim 1, wherein the peripheral portion comprises aluminum or an aluminum copper or a titanium aluminum alloy.

7. The Group III nitride device of claim 1, further comprising:
a second ohmic contact arranged on and forming an ohmic contact to the multilayer Group III nitride device structure; and
a gate laterally positioned between the first ohmic contact and the second ohmic contact and forming a gate contact to the multilayer Group III nitride structure.

8. The Group III nitride device of claim 7, wherein the second ohmic contact comprises:
a base portion having a conductive surface comprising a peripheral portion and a central portion that are substantially coplanar and of differing composition;
a conductive via positioned on the central portion of the conductive surface of the second ohmic contact; and
a contact pad positioned on the conductive via of the second ohmic contact.

9. The Group III nitride device of claim 1, further comprising:
a gate contact that includes a gate conductive via positioned on the Group III nitride-based structure and a gate contact pad positioned on the gate conductive via.

10. The Group III nitride device of claim 9, wherein the gate contact is a Schottky contact.

11. The Group III nitride device of claim 9, wherein the Group III nitride-based structure includes a Group III nitride barrier layer, and wherein a base of the gate contact is positioned within a thickness of the Group III nitride barrier layer.

12. The Group III nitride device of claim 9, wherein the first ohmic contact provides a source contact, and wherein a distance between the first ohmic contact and the gate contact, as measured at a base of the first ohmic contact and the gate contact, is 250 nm or less.

13. The Group III nitride device of claim 9, wherein a gate length for the Group III nitride device is 250 nm or less.

14. The Group III nitride device of claim 1, further comprising:
an insulated gate contact.

15. The Group III nitride device of claim 14, further comprising:
- a dielectric layer arranged on the multilayer Group III nitride structure, the dielectric layer having an opening; and
- a gate insulating layer disposed in the opening in the dielectric layer such that the gate insulating layer lines sidewalls of the opening formed by the dielectric layer and a base formed by the multilayer Group III nitride structure,
- wherein the insulated gate contact includes a gate metal formed on the gate insulating layer.

16. The Group III nitride device of claim 1, wherein the conductive via has a lateral extent which is less than a lateral extent of the base portion.

17. The Group III nitride device of claim 16, wherein the lateral extent of the conductive via is less than a lateral extent of the central portion of the conductive surface.

18. The Group III nitride device of claim 1, wherein the base portion of the first ohmic contact includes a well and a lower portion, wherein the well comprises a metal or alloy of a first composition and extends into the lower portion, and wherein the lower portion comprises a metal or alloy of a second composition different from the first composition.

19. The Group III nitride device of claim 18, wherein an upper surface of the well provides the central portion of the conductive surface, and wherein an upper surface of the lower portion provides the peripheral portion of the conductive surface.

20. The Group III nitride device of claim 18, wherein the well and the central portion of the conductive surface comprise a conductive barrier material, and wherein the lower portion and the peripheral portion of the conductive surface comprise an ohmic contact material.

* * * * *